United States Patent [19]

Kienast

[11] Patent Number: 5,067,915
[45] Date of Patent: Nov. 26, 1991

[54] PLUG-IN COMPONENT

[75] Inventor: Fritz Kienast, Erlangen, Fed. Rep. of Germany

[73] Assignee: Siemens Aktiengesellschaft, Berlin and Munich, Fed. Rep. of Germany

[21] Appl. No.: 91,356

[22] Filed: Aug. 28, 1987

Related U.S. Application Data

[63] Continuation-in-part of Ser. No. 783,499, Oct. 3, 1985, abandoned.

[30] Foreign Application Priority Data

Oct. 23, 1984 [DE] Fed. Rep. of Germany ....... 3438824

[51] Int. Cl.⁵ ............................................. H01R 13/66
[52] U.S. Cl. .................................... 439/620; 439/679; 361/119
[58] Field of Search ................. 439/620, 679; 361/111, 361/119

[56] References Cited

U.S. PATENT DOCUMENTS

| 2,688,123 | 8/1954 | Benham et al. | 339/184 M |
| 3,519,977 | 7/1970 | Swearingen | 339/185 R |
| 3,697,927 | 10/1972 | Kunkle et al. | 339/184 M |
| 3,701,082 | 10/1972 | Baumanis | 339/185 R |
| 4,113,340 | 9/1978 | Rapata | 339/113 R |
| 4,178,061 | 12/1979 | Ahroni | 339/147 P |
| 4,205,890 | 6/1980 | Bryant | 339/184 M |
| 4,245,875 | 1/1981 | Shaffer et al. | 339/184 M |
| 4,249,788 | 2/1981 | McNeel | 339/49 R |
| 4,423,916 | 1/1984 | Muehlhausen, II | 339/59 M |
| 4,478,476 | 10/1984 | Jones | 339/147 R |
| 4,531,806 | 7/1985 | Hsieh | 339/147 R |
| 4,654,743 | 3/1987 | Ruehl et al. | 439/620 |

FOREIGN PATENT DOCUMENTS 2835346 2/1980 Fed. Rep. of Germany.
2223937 10/1974 France.

OTHER PUBLICATIONS

AMP Company publication, catalogue of AMP Positive Lock, model No. 094—EU.

Primary Examiner—Gary F. Paumen
Attorney, Agent, or Firm—Adel A. Ahmed; John L. James

[57] ABSTRACT

A diode plug-in component for a contact strip includes a housing having contact elements, at least one locking flat plug receptacle and longitudinal holes whose openings are arranged on the surface facing the contact strip. A plurality of diodes are arranged in the housing and are connected in an electrically conductive fashion with the contact elements. To assure a plug-in connection, the arrangement of the flat plug receptacle and the contact elements to each other corresponds to the arrangement of a flat plug and the plug contacts to each other.

3 Claims, 2 Drawing Sheets

PLUG-IN COMPONENT

CROSS-REFERENCE TO RELATED APPLICATION

This is a continuation-in-part of Ser. No. 06/783,499 filed Oct. 3, 1985, now abandoned.

FIELD OF THE INVENTION

The invention pertains to a diode plug-in component for a contact strip (multiple plug) whose ends are fitted with at least one flat plug each and which has several plug contacts arranged in a matrix.

DESCRIPTION OF THE RELATED ART

In said plug-in components, which can be obtained in the market, mechanical loads, e.g., vibrations, can affect the quality of the plug connection. Moreover, in case of a high or long-lasting mechanical load, the plug connection can loosen and the plug-in component can be lost.

A contact system built by the AMP company is known from their brochure AMP Positive Lock 094-EU, D/El-3/84, which was developed for use in constructing motor vehicles where vibration and mechanical quality of normal plug connections can be influenced in the long run. The particular characteristics of said contact system are the low plug-in forces required while simultaneously attaining high mechanical stability. This is obtained by having a meshing spring element contained in the receptacle. The flat plug of this contact system presses the mating hook of the receptacle downwards when being plugged in. Upon attaining its end setting, the mating hook locks into the mating hole of the flat plug. When retracting the housing, the spring clip is pressed down until the mating hook releases the flat plug again.

It is an object of this invention to design a diode plug-in component for a contact strip of the above-specified type so that the diode plug-in component forms a vibration- and/or shake-proof connection in conjunction with the contact strip.

SUMMARY OF THE INVENTION

The foregoing object is achieved by this invention by having a housing for the diode plug-in component fitted with contact elements with at least one locking flat plug receptacle and with slotted holes, whose openings are arranged on the surface facing the contact strip, by having a plurality of diodes arranged in the housing and connected in an electrically conducting fashion with the contact components, and by having the coordination of the flat plug receptacle and a contact element and/or the contact elements to each other correspond to the coordination of a flat plug and a plug contact and/or the plug contacts among each other. There thereby results a design having a diode plug-in component requiring low plug-in forces while simultaneously assuring a high mechanical holding force, whose plug connection with a contact strip is vibration- and/or shake-proof. By this design of the diode plug-in component, at least one flat plug of the contact strip, which is normally designed to carry electrical potential, is used for purposes of mechanical fastening to the strip only.

In a preferred embodiment of the design of the diode plug-in component, the housing in the area of the contact elements is equipped with an indentation, and the openings of the contact elements are arranged in the narrow surface of the indentation facing the contact strip. Thereby the plug contacts of the contact strip designed for the electrical connection of the diodes of the diode plug-in component can be fitted with two windings of wire-wrapping arranged between the contact strip and the narrow surface of the indentation of the diode plug-in component.

In a further preferred embodiment of the invention, the side surfaces of the housing of the diode plug-in element are equipped in the area of the diodes with vertical slots. This design characteristic of the housing permits checking whether the diodes are properly aligned in the housing for their intended purpose.

BRIEF DESCRIPTION OF THE DRAWINGS

For a further discussion of the invention, reference is made to the drawing in which an embodiment of the diode plug-in component in accordance with the invention is shown schematically.

DETAILED DESCRIPTION OF THE PREFERRED EMBODIMENTS

Figures 1A, 1B, 2A, 2B:
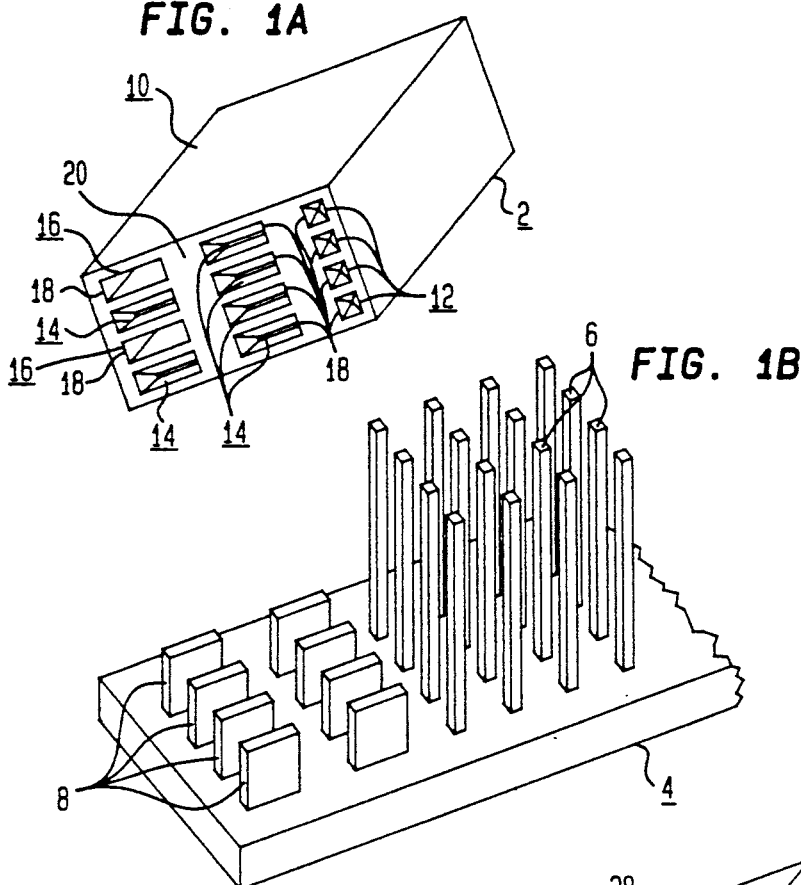
FIGS. 1A and 1B show a first embodiment of the diode plug-in component in accordance with the invention.
FIGS. 2A and 2B show a second embodiment of the diode plug-in component.
Figure 5:
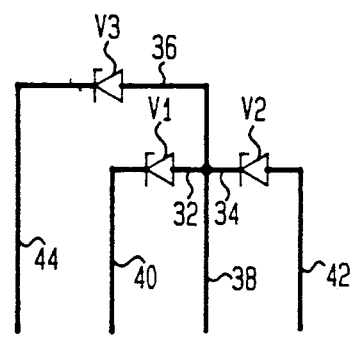
FIG. 5 shows a connection diagram for the diodes of the diode plug-in element.

In the design according to FIGS. 1A and 1B, the illustration show a diode plug-in component 2 and a contact strip 4. The contact strip 4, also known as the plug board, comprises several plug contacts 6 arranged in the matrix containing several flat plugs 8 at their respective ends. Plug contacts 6, for example, can be designed as commercially available connector pins for non-soldered electrical connection, for example using wire-wrap technology. The flat plugs 8 are also arranged in a matrix. At least one flat plug 8 of contact strip 4 is designed only for mechanical fastening of the diode plug-in component 2. The diode plug-in component 2 for contact strip 4 consists of a housing 10 fitted with diodes 9. Instead of diodes 9, breakdown diodes may be provided. The diodes 9 are electrically connected to contact elements 12 arranged in housing 10 according to their application. The electrical connection schematic of these electrically conductively connected diodes 9 is illustrated in FIG. 5. Such a diode plug-in component fitted with breakdown diodes plugged into a contact strip can protect the assemblies wired together by means of the contact strip from excessively high voltages at their power supply inputs. Moreover, housing 10 is fitted with locking flat plug receptacles 14 and slot holes 16, whose holes 18 are arranged in the surface 20 facing the contact strip 4. The arrangement of the locking flat plug receptacles 14 and the contact elements 12 and the coordination of contact elements 12 among each other within diode plug-in component 2 corresponds to the arrangement of the flat plug contacts 6 to each other on contact strip 4. The design thus provides a diode plug-in component 2 requiring slight mounting forces while simultaneously assuring high mechanical holding force, whose plug-in connection with a contact strip 4 is vibration- and/or shake-proof.

FIGS. 2A and 2B show a diode plug-in component whose housing 10 is equipped with an indentation 22 in the area of the contact elements 12. The openings 18 of these contact elements 12 are arranged on a narrow surface 24 of indentation 22 facing contact strip 4. Said narrow surface 24 of indentation 22 and the surface 20 facing the contact strip 4 of diode plug-in component 2 are arranged parallel to each other at a preset distance. Said distance is selected to permit at least two windings of a wire-wrapping to be arranged around the plug contacts 6 designed for the power supply of diodes 9 of plug-in component 2. In addition, the sides surfaces 26 of housing 10 of diode plug-in component 2 are fitted in the area of diodes 9 with vertical slots 28. By means of said slots a check can be performed to determine whether diodes 9 are arranged properly in housing 10 in accordance with their intended use. In addition, slot holes 16 can always be fitted with a rib 30 arranged vertically to one of the said surfaces of slot hole 16. Said ribs 30 prevent any improper insertion of the plug-in component 2, particularly a breakdown diode plug-in component, onto contact strip 4. Thereby the design produces a diode plug-in element 2, e.g. a breakdown diode plug-in component, to protect the assemblies against overvoltage from a power supply, whose plug-in connection with the contact strip 4 is vibration- and/or shake-proof and wherein the plug elements 6 which are designed for the power supply of diodes 9 of diode plug-in component 2, are also capable of being used to wire-connect assemblies.

Figure 3:
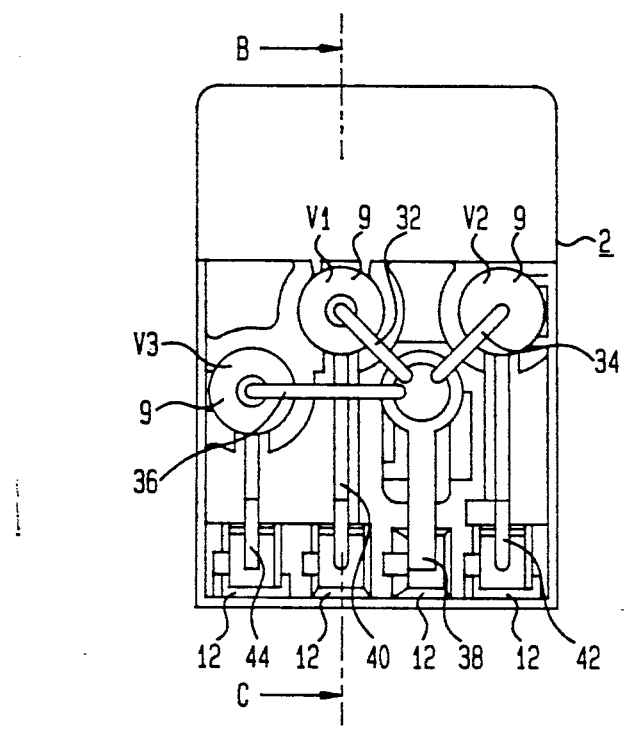
FIG. 3 shows a view into the diode plug-in element in accordance with arrow A in FIG. 2A.

FIG. 3 shows a view into diode plug-in component 2 in accordance with arrow A in FIG. 2A. Three diodes 9, having reference characters V1, V2 and V3 are arranged substantially adjacent one another in diode plug-in component 2. FIG. 5 shows the electrical circuit showing the interconnections of diodes V1, V2, and V3. The view into the interior of diode plug-in unit 2 shows that diodes 9 arearranged axially parallel and that connections 32, 34, and 36 facing the removed lid are brought to a central connection 38, also referred to as a node point. Connections 40, 42, and 44, facing away from the lid are respectively brought to a contact element 12.

Figure 4:
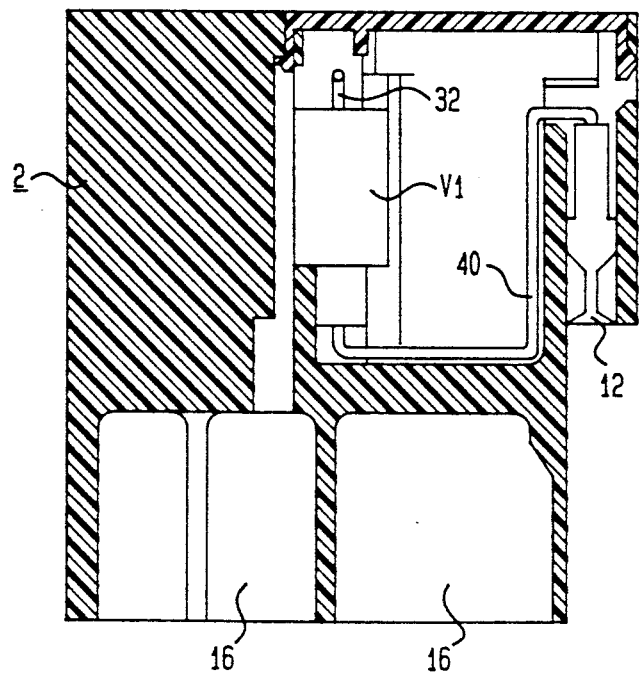
FIG. 4 is a section view in accordance with section line B-C in FIG. 2A.

FIG. 4 shows a sectional view of diode plug-in component 2 in accordance with section line B-C in FIG. 3. Diode plug-in component 2 is divided into two regions, namely an upper and a lower region. Diodes 9, of which diode V1 is visible, are arranged in the upper region. Locking flat plug receptacles and slot holes 16 are arranged in the lower region, one of the slot holes having therein a rib 30.

What is claimed as new and desired to be secured as Letters Patent of the United States is:

1. A diode plug-in component for a contact strip, said contact strip having a planar surface defined with two adjacent end portions, one end portion being fitted with at least one flat plug having a flat shape with a lateral width and a height projecting in a vertical direction from said planar surface primarily for forming a stable mechanical connection, and the adjacent other end portion having a plurality of plug contacts arranged in a matrix thereon, said plug contacts having a different shape from said at least one flat plug and projecting in the vertical direction primarily for forming respective electrical connections, said diode plug-in component comprising:

a housing of said diode plug-in component having side walls forming an insulated enclosure and a contact surface adapted for being placed in contact with the contact strip, contact elements in said housing for forming desired connections with the plug contacts of said contact strip, at least one locking flat plug receptacle arranged at one end portion of said contact surface adapted for receiving and locking said at least one flat plug of said contact strip therein, and a plurality of slotted holes arranged at another end portion of said contact surface having openings facing the contact strip adapted for receiving respective ones of said plugs contacts of said contact strip therein; and a plurality of diodes arranged in said housing and being connected in an electrically conductive fashion with the contact elements to be connected with the plug contacts, and wherein the arrangement of the at least one flat plug receptacle and the slotted holes of said diode plug-in component corresponds with the arrangement of the at least one flat plug and the plug contacts of said contact strip, whereby the connection of the at least one flat plug in the locking flat plug receptacle is used primarily to form a stable mechanical connection for said diode plug-in component in conjunction with the connection of the plug contacts in the slotted holes used to form electrical connections, and the diodes are arranged to be self-contained with the contact elements in the housing.

2. A diode plug-in component in accordance with claim 1, wherein the housing includes an indentation in the end portion of said contact surface having said slotted holes and the openings of the slotted holes are arranged along a narrow surface of the indentation facing the contact strip.

3. A diode plug-in component in accordance with claim 1, wherein the side walls of the housing include vertical slots therein for permitting checking of the arrangement of the diodes in said housing for their intended use.

* * * * *